(12) United States Patent
Nemoto et al.

(10) Patent No.: US 6,189,733 B1
(45) Date of Patent: Feb. 20, 2001

(54) COMPONENT FEEDER

(75) Inventors: Akira Nemoto; Shigeki Takahashi; Nihei Kaishita, all of Omihachiman (JP)

(73) Assignee: Murata Manufacturing Co., Ltd., Nagaokakyo (JP)

( * ) Notice: Under 35 U.S.C. 154(b), the term of this patent shall be extended for 0 days.

(21) Appl. No.: 09/358,428

(22) Filed: Jul. 22, 1999

(30) Foreign Application Priority Data

Aug. 21, 1998 (JP) .................................................. 10-235104
Jun. 15, 1999 (JP) .................................................. 11-167660

(51) Int. Cl.[7] .................................................... B23Q 7/12
(52) U.S. Cl. ........................................... 221/162; 221/277
(58) Field of Search .................................... 221/159, 162, 221/182, 163, 167, 277; 193/44

(56) References Cited

U.S. PATENT DOCUMENTS 3,298,491 * 1/1967 Quest et al. ......................... 221/162

FOREIGN PATENT DOCUMENTS 2 011 747   9/1971 (DE) .
195 16 981  11/1995 (DE) .
9-180348    7/1997 (JP) .

* cited by examiner

Primary Examiner—Kenneth W. Noland
(74) Attorney, Agent, or Firm—Burns, Doane, Swecker & Mathis, LLP

(57) ABSTRACT

A component feeder minimizes damage to chip components and efficiently discharges chip components aligned in a line. A bulk case is attached on the top portion of an external storage housing capable of being supplied with a large number of chip components. A predetermined number of the chip components is supplied at a time from the external storage housing to an inner housing of a component storage housing via a supplying path. The chip components in the inner housing enter into the outer housing from the reception inlet via a guide path by being scooped up by pockets in accordance with rotation of a rotary drum. The chip components are dropped into an aligning groove to be aligned and are discharged aligned in a line via a gate and a discharge path. The chip components slide down on the aligning groove to be discharged to a discharge path, via the gate, aligned in a line. Since excess components in the outer housing are returned to the inner housing via the return path by raking them up by a raking-up portion formed in the rotary drum, the number of chip components in the outer housing is small, resulting in maintaining increased alignment efficiency.

23 Claims, 10 Drawing Sheets

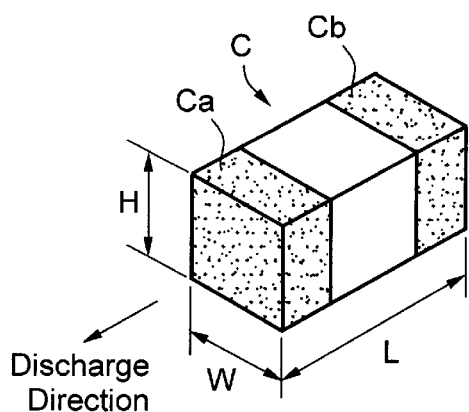
FIG. 7
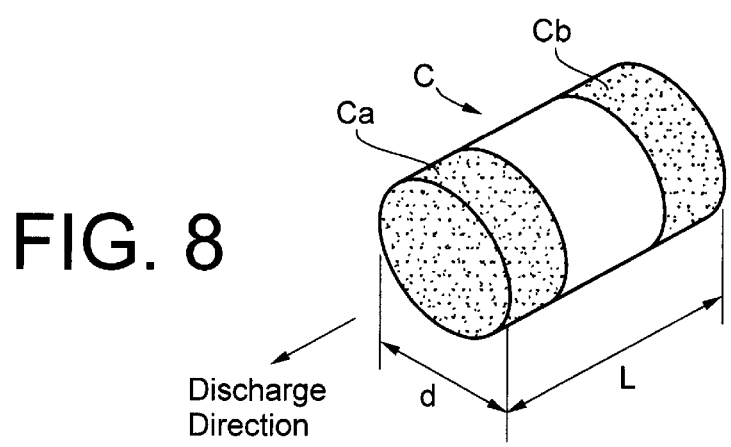
FIG. 8
FIG. 9A   FIG. 9B
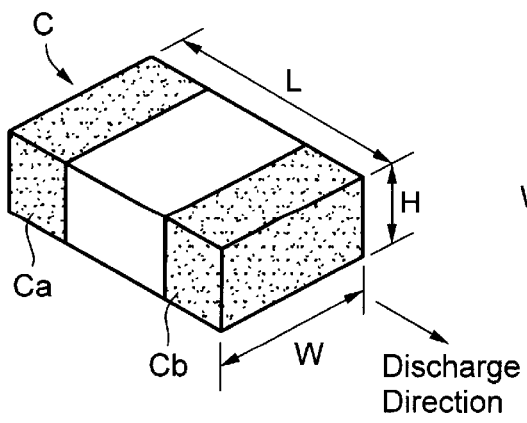 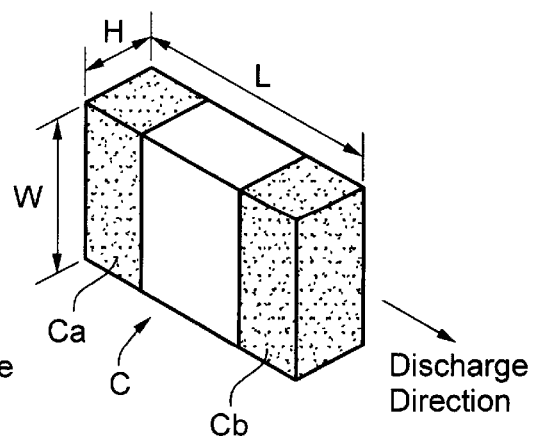

COMPONENT FEEDER

BACKGROUND OF THE INVENTION

1. Field of the Invention

The present invention relates to a component feeder for feeding a large number of chip components aligned in a line.

2. Description of the Related Art

As conventional component feeders, bulk feeders and vibrating hopper feeders are known. The bulk feeders may be roughly classified into the disentanglement-by-air type and the disentanglement-by-thrust-up-pin type. In the air type, there is a problem of difficulty in adjusting the amount and the direction of air, while in the thrust-up pin type, there is a problem in that components are prone to be damaged as the pin strikes components at each stroke. Since chip components are simultaneously directed toward a funnel-shaped outlet in either of these types, even if an entanglement is broken once, another entanglement will form, resulting in decreased feeding efficiency. In contrast, in the vibrating hopper feeder, although entanglements are difficult to form, there are problems in that the apparatus is expensive, vibrations may be transmitted to other apparatuses, and a large space is required for installation.

In order to solve these problems, Japanese Patent Application No. 9-180348 of the same assignee (which is not published yet), proposed a component feeder having a simple structure and high efficiency in aligning and discharging components. This component feeder comprises a component storage housing for accommodating chip components disposed between a fixed drum and a rotary drum, an aligning groove disposed on the inner surface of the fixed drum to slide the chip components downward aligned in a predetermined direction, a gate disposed in the bottom end of the aligning groove to pass chip components individually to slide down along the aligning groove in a predetermined orientation therethrough, and a discharge path for discharging the chip component passed through the gate in an aligned state. On the inner surface of the rotary drum, lug members are provided for urging a component stopping at the gate in an abnormal orientation to move toward the direction opposite to discharge so as to undo the blockage.

In this component feeder, chip components are dropped into the aligning groove so as to be aligned in a predetermined direction, then are passed through the gate so as to be aligned in a predetermined orientation, and moreover, blockages are cleared by the lug members of the rotary drum, resulting in high efficiency in aligning and discharging components. However, since chip components are directly supplied to the component storage housing, in consideration of efficiency in aligning and discharging of chip components, it is not preferable to supply a large number of chip components. When a large number of chip components is supplied in an enlarged component storage housing, extended agitation time of chip components produces a risk of damage to components.

SUMMARY OF THE INVENTION

Accordingly, it is an object of the present invention to provide a component feeder with a small risk of damage to chip components and which has high efficiency in supplying components by aligning them in one line.

In order to accomplish the above-mentioned object, in accordance with the present invention, a component feeder comprises a feeder body; a rotary drum rotating relative to the feeder body about a horizontal axis; a component storage housing formed between the feeder body and the rotary drum for storing chip components; a circumferential wall formed in the rotary drum, which divides the component storage housing into an inner housing and an outer housing; supplying means for supplying a predetermined number of chip components at a time from the inner housing to the outer housing in accordance with the rotation of the rotary drum; an aligning and discharging section disposed in the outer housing for aligning chip components in a line and discharging them; a return path for returning chip components from the outer housing to the inner housing; and raking-up means rotating along the outer housing for raking up excess chip components in the outer housing so as to return them to the inner housing via the return path.

The chip components supplied to the inner housing of the component storage housing are transferred at the rate of a predetermined number thereof from the inner housing to the outer housing by the supplying means in accordance with the rotation of the rotary drum. The chip components entered in the outer housing are discharged by the aligning and discharging section aligned in a line. When the number of chip components in the outer housing is excess, problems may arise such as the possibilities of entanglement, decreased aligning efficiency, and damage to components by meshing with each other. However, since the excess chip components in the outer housing are raked up by the raking means to be returned to the inner housing via the return path, the number of components in the outer housing is comparatively small, resulting in increasing aligning efficiency and reduction of damage to components.

In a component feeder according to the present invention, the supplying means may comprise a pocket disposed in the circumferential wall for raking up a predetermined number of chip components in the inner housing at a time in accordance with the rotation of the rotary drum, a reception inlet disposed in a position of the feeder body facing to the inner housing for receiving chip components raked by the pocket, and a guide path disposed in the feeder body for guiding chip components received by the reception inlet to the outer housing, or the supplying means may be a communicating path formed so as to form connections between the inner peripheral side of the circumferential wall and the outer peripheral side thereof for transferring chip components from the inner housing to the outer housing in accordance with the rotation of the rotary drum.

The above-mentioned raking-up means may be formed separated from the rotary drum; when it is unitarily formed with the rotary drum, the raking-up means rotates unitarily with the rotary drum without requiring another power source, resulting in a simple structure. It is preferable that the raking up means generally have the same sectional shape as the cross-section of the outer housing.

When chip components are supplied to the return path by raking means at the high rotating speed of the rotary drum, the flipped chip components are difficult to enter into the return path. Therefore, excess components accumulate in the outer housing so as to decrease aligning efficiency. Accordingly, the raking-up means may preferably be a return lug member protrudingly formed on the outer peripheral surface of the circumferential wall, wherein the return path is a communicating path which passes through the circumferential wall from the immediately front position of the return lug member in the rotational direction so as to communicate with the inner peripheral side of the circumferential wall, being inclined toward the outer diameter of the rotary drum relative to the rotational direction thereof. That is, the chip components struck by the return lug member can easily enter into the return path by positioning the aperture of the return path at the immediately front position of the return lug member in the rotational direction. Since the return path is inclined toward the outer diameter of the rotary drum relative to the rotational direction thereof, when the return path is rotated to the upper portion of the rotary drum, the inclination angle thereof is steep so that the chip components in the return path can be easily dropped into the inner housing. In contrast, when the return path is rotated to the lower portion of the rotary drum, the inclination angle thereof is gentle and the chip components pass through over the aperture of the return path in the outer housing side, resulting in preventing the chip components from reversing from the inner housing to the outer housing.

A component feeder further may preferably comprise an external storage housing disposed in the upper portion of the inner housing; and a supplying path for supplying the chip components from said external storage housing to the inner housing, being inclined downward from the external storage housing toward the inner housing. In this case, since chip components are aligned after being transferred in two cascaded stages, from the outer storage housing to the inner housing and in turn to the outer housing, even when a large number of chip components is supplied into the outer storage housing, agitating time of chip components can be reduced, and aligning efficiency can be increased. Since the chip component slides down by its own weight on the supplying path, external forces such as agitation forces are not exerted on the chip components in the path between the outer storage housing and the inner housing, resulting in reduced damage to the chip components.

A component feeder may preferably further comprise a bulk case for accommodating a predetermined number of chip components, the bulk case being detachably disposed with an opening potion thereof directed downward on a component supplying inlet formed in the upper portion of the external storage housing. In this case, the chip components in the bulk case can be automatically fed to the outer storage housing by gravity so that the feeding operation can be automated.

The aligning and discharging section may be preferably formed on an inner surface of the feeder body forming the outer housing, the aligning and discharging section comprising an aligning groove for aligning chip components in a predetermined direction so as to slide the chip components downward, a gate formed at a lower end of the aligning groove for passing the chip components therethrough sliding along the aligning groove in a predetermined orientation one at a time, and a discharge path joined to a lower portion of the gate, being inclined downward, wherein the rotary drum is provided with a lug member for urging the chip component standing at the gate in an abnormal orientation to move in the direction opposite to that of discharge so as to clear the blockage. In this case, the chip components are aligned simultaneously in a predetermined direction when the chip components are dropped into the aligning groove. For example, when a chip component is of a rectangular shape having a length greater than a height and a width thereof, the width of the aligning groove is established to be greater than the width and height of the chip component and to be smaller than the length thereof as well, so that the chip component can be longitudinally aligned in the aligning groove. The chip components dropped into the aligning groove slide down by gravity to the gate. At the gate, the chip components in a normal orientation (a sideways horizontal orientation, for example) can pass therethrough as they are to be discharged to the discharge path, while the chip components in an abnormal orientation (a standing orientation, for example) are blocked by each other at the gate. Then the lug member of the rotary drum urges a chip component which has stopped at the gate to move in the direction opposite to that of discharging so as to remove the chip component from the gate or to push the chip component down to the normal orientation. This results in clearing of the blockage so that subsequent chip components may be discharged from the gate.

BRIEF DESCRIPTION OF THE DRAWINGS

FIG. 7 is a schematic view of an example of a chip component;

FIG. 8 is a schematic view of another example of a chip component;

FIGS. 9A and 9B are schematic views of other examples of chip components;

DESCRIPTION OF THE PREFERRED EMBODIMENTS

Figure 1:
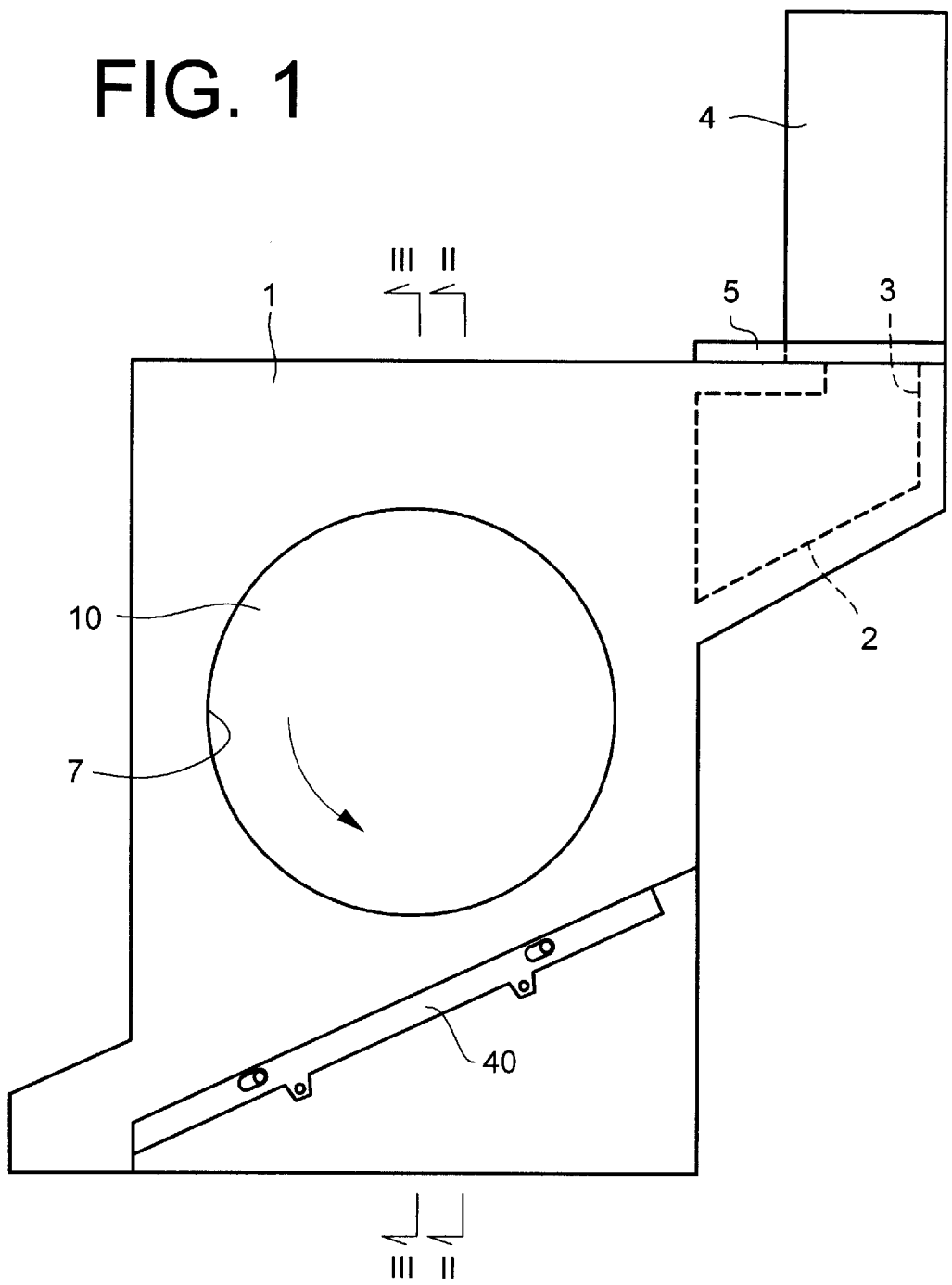
FIG. 1 is a front view of a component feeder according to a first embodiment of the present invention.
Figure 2:
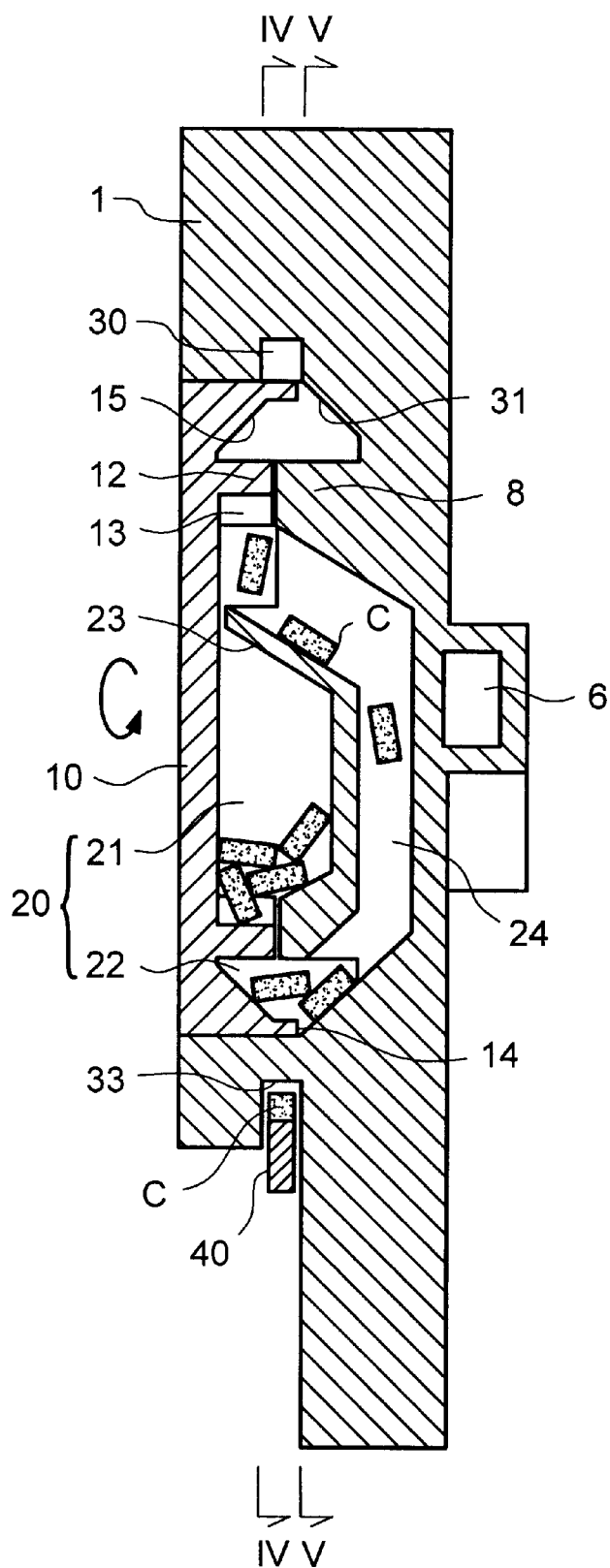
FIG. 2 is a sectional view along line II—II of FIG. 1.
Figure 3:
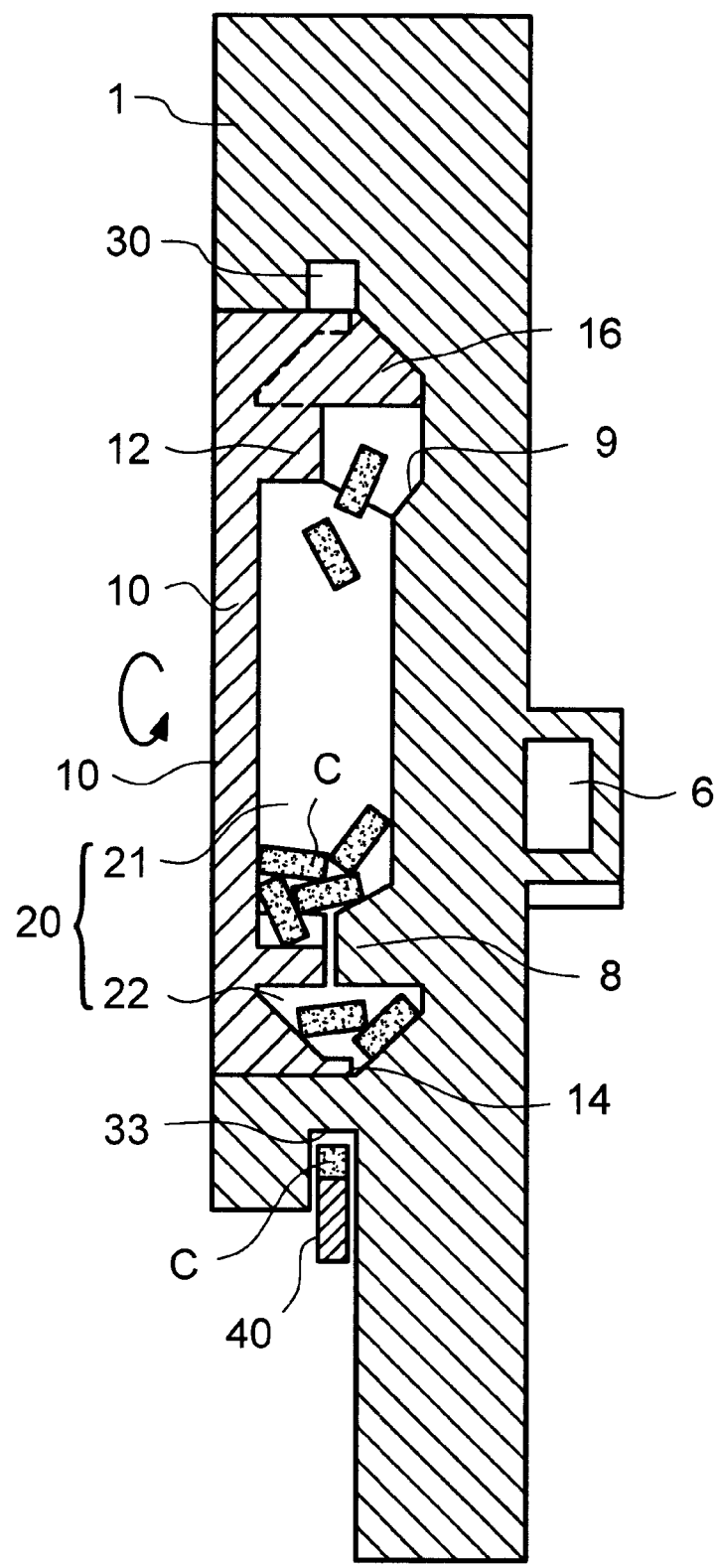
FIG. 3 is a sectional view along line III—III of FIG. 1.

FIGS. 1 to 6 show a first embodiment of a component feeder according to the present invention.

In this embodiment, while, as shown in FIG. 7, a rectangular-shaped chip component "C" which has a height "H", a width "W", and a length "L" ("H"≈"W", "L">"H", "L">"W") is used, it may be a cylindrical chip component "C" having a diameter "d" and a length "L" ("d"≈"W", "H", "L">"d"), as shown in FIG. 8, or may be a rectangular chip component "C" having a difference between a width "W" and a height "H" ("L">"W">"H"), as shown in FIGS. 9A and 9B. In addition, "Ca" and "Cb" indicate terminals disposed in both ends of the chip component "C" in a longitudinal direction thereof. In FIGS. 2 to 6, the chip component "C" is illustrated enlarged in order to facilitate understanding.

A component feeder body 1 comprises a generally plate-shaped member disposed in the vertical direction, in the top portion of the rear end thereof, an external storage housing 2 being formed, on which a component supplying inlet 3 is disposed. On the component supplying inlet 3, a bulk case 4 for accommodating a predetermined number of chip components "C" is detachably disposed with an opening potion 4a thereof directed downward. That is, a mating and demating portion 5 is formed on the inlet periphery of the component supplying inlet 3, and the bottom end of the bulk case 4 is engaged with the mating and demating portion 5 by laterally sliding the bulk case 4, enabling the bulk case 4 to be detachable. In the state of the bulk case 4 mated with the component supplying inlet 3, by opening a conventional shutter fitted to the bulk case 4, chip components "C" in the bulk case 4 are supplied into the external storage housing 2.

When the bulk case 4 is mounted on the component supplying inlet 3 in this manner, the volume of the external storage housing 2 can be substantially increased.

The bottom surface 2a of the external storage housing 2 is formed to be inclined, and in the lowest portion thereof is formed an inlet 6a of a supplying path 6 for supplying the chip components "C" to an inner housing 21 of a component storage housing 20, which will be described, from the external storage housing 2. The supplying path 6 is inclined downward from the external storage housing 2 toward the inner housing 21 so that the chip component "C" can slide down by its own weight.

In the front-side center portion of the body 1, a circular concave portion 7 is formed, in which a rotary drum 10 is rotatably fitted about a horizontal axis. The rotary drum 10 is driven by a driving apparatus (not shown) in the direction indicated by the arrow. The drive system may be either a continuous or an intermittent one. As shown in FIGS. 2 to 5, the component storage housing 20 is formed between the body 1 and the rotary drum 10. The component storage housing 20 is divided into the inner housing 21 and an outer housing 22 by a circumferential wall 12 formed in the rotary drum 10.

An aperture 6b to the inner housing 21, which is an outlet of the supplying path 6, is formed in the vertically intermediate position of the inner housing 21, preferably slightly lower than the vertically center position of the inner housing 21, resulting in preventing more than the required number of chip components "C" from entering into the inner housing 21. In addition, the volume of the inner housing 21 is smaller than that of the external storage housing 2.

In the inner periphery of the circumferential wall 12, a plurality of pockets 13 (in this embodiment, four pockets spaced at 90°) is formed for scooping up a predetermined number of chip components "C" in the inner housing 21 in accordance with the rotation of the rotary drum 10. In a portion of the body 1 facing to the inner housing 21 is provided a reception inlet 23 for receiving the chip components "C" scooped up by the pockets 13. The reception inlet 23 is vertically positioned higher than the rotating center of the rotary drum 10. In the body 1 is formed a guide path 24 for guiding the chip components "C" received by the reception inlet 23 toward the outer housing 22 by their own weights.

An annular rib 8 which is closely disposed opposing the circumferential wall 12 of the rotary drum 10 is unitarily formed inside the concave portion 7 of the body 1. The upper portion of the annular rib 8 is cut off in a given range toward the rotating direction of the rotary drum 10 so that the cut-off portion is to be a return path 9 for returning chip components "C" from the outer housing 22 to the inner housing 21. On the other hand, a raking-up portion 16 is unitarily formed with the outer periphery of the circumferential wall 12 of the rotary drum 10. The raking-up portion 16, having generally the same sectional shape as the cross-section (except for an aligning groove 30) of the outer housing 22, returns excess components in the outer housing 22 to the inner housing 21 via the above-mentioned return path 9 by raking up them.

An aligning discharge portion for discharging chip components "C" aligning in one line is formed in the outer housing 22. The aligning discharge portion comprises an aligning groove 30, a gate 32, a discharge path 33, and lug members 14.

In this embodiment, the aligning groove 30 is a semicircular groove formed on the inner periphery surface of the concave portion 7 of the body 1, having a width wider than the width "W" of the chip component "C" by a predetermined clearance, and a depth deeper than the height "H" of the chip component "C" by a predetermined clearance. On the inner periphery surface of the concave portion 10, a guide surface 31 is formed tapering in the direction of the cross-sectional surface of the aligning groove 30. This guide surface 31 is inclined toward the aligning groove 30 for guiding the chip component "C" toward the aligning groove 30. On the inner surface of the rotary drum 10, a guide surface 15 is formed in an opposed relation to the guide surface 31 of the body 1. The guide surfaces 31 and 15 are not limited to a tapered shape, and they may be any shape allowing them to slide the chip component "C" into the aligning groove 30.

At the bottom end of the aligning groove 30, the gate 32 is formed through which the chip component "C" can pass one by one longitudinally and sideways. That is, the gate 32 has a height and a width which are slightly larger than "H" and "W", and are smaller than "L". The width of the gate 32 is equal to that of the aligning groove 30. Below the gate 32, the discharge path 33 is formed in the body 1.

Figure 4:
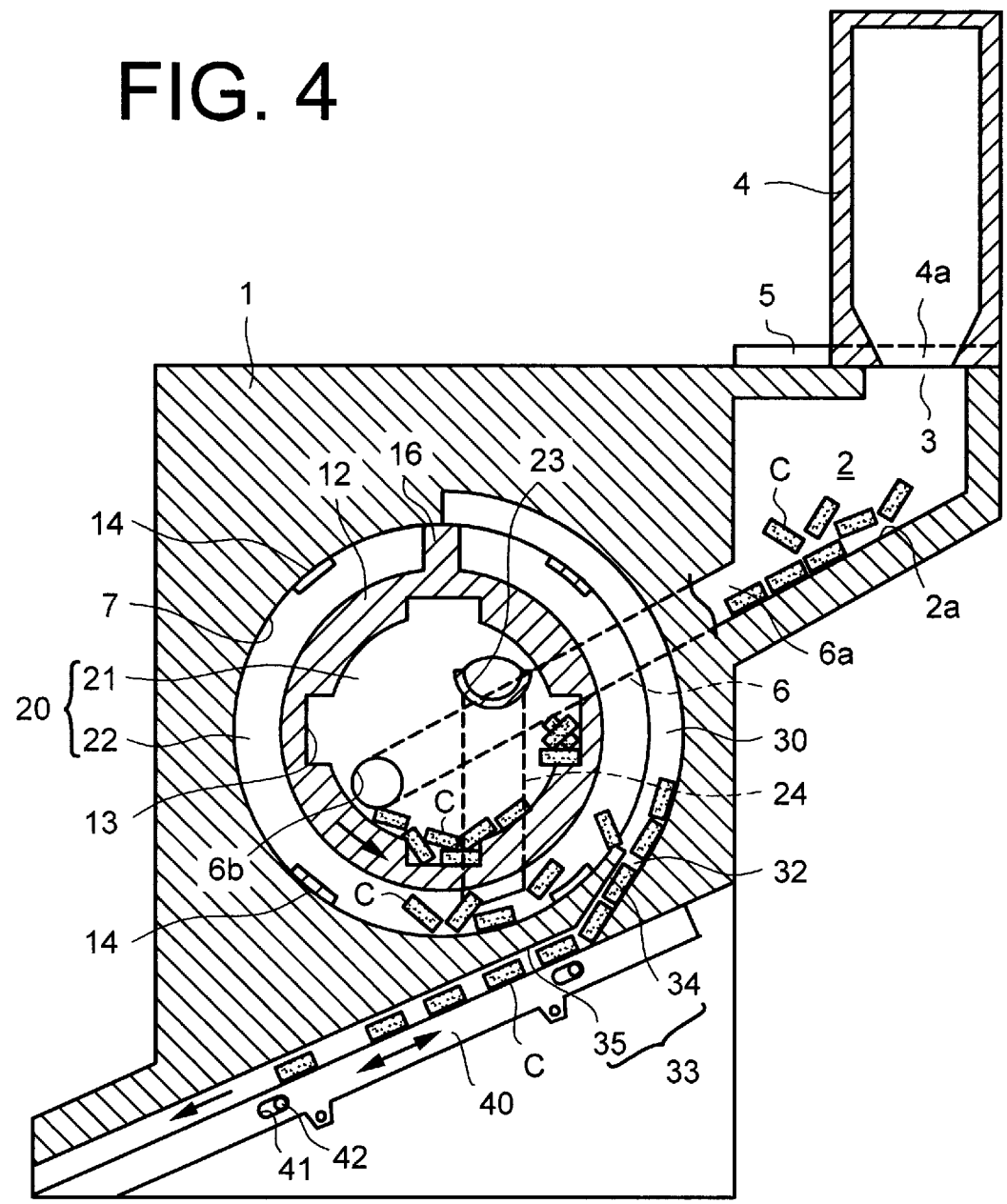
FIG. 4 is a sectional view along line IV—IV of FIG. 2.
Figure 5:
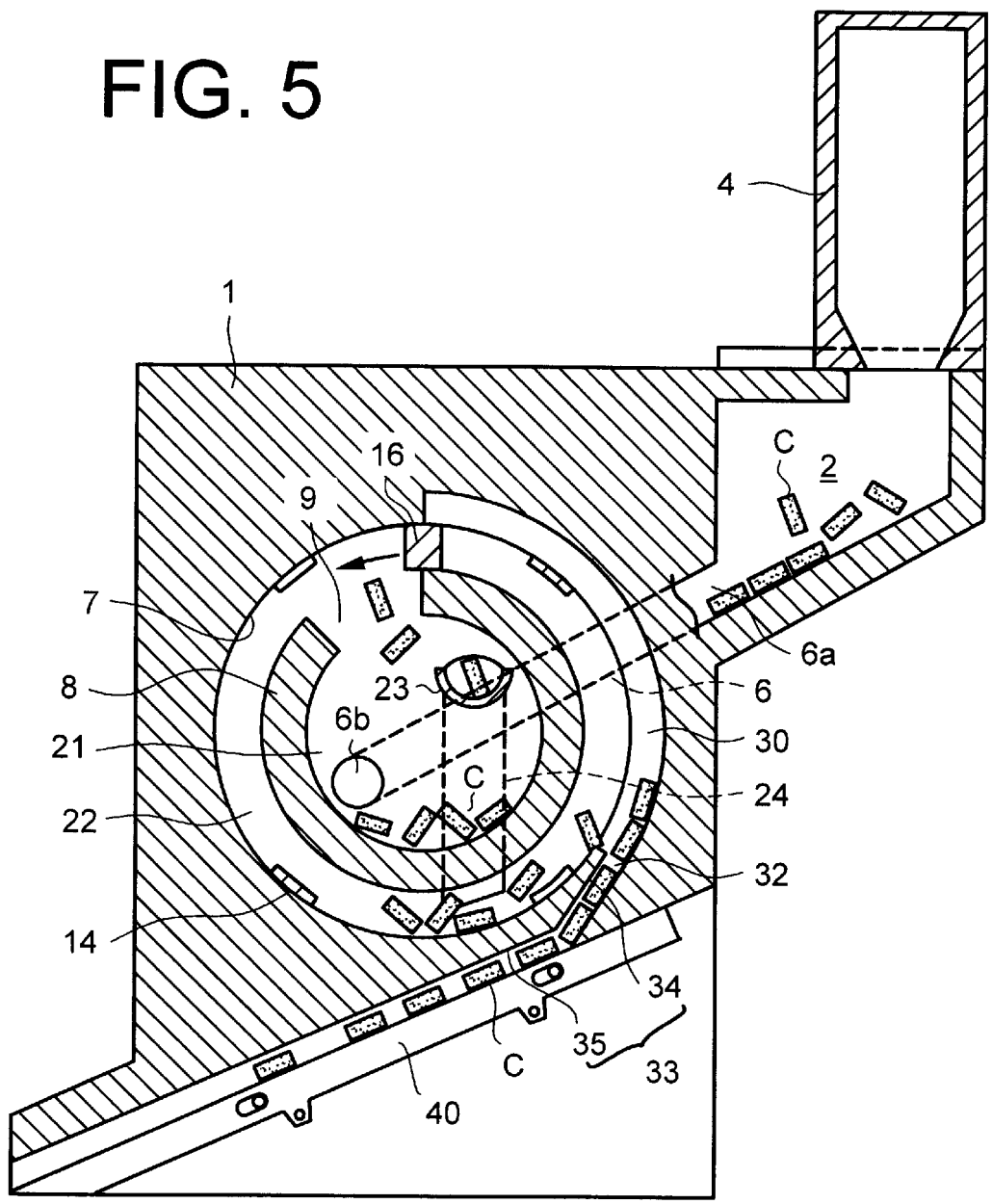
FIG. 5 is a sectional view along line V—V of FIG. 2.
Figure 6:
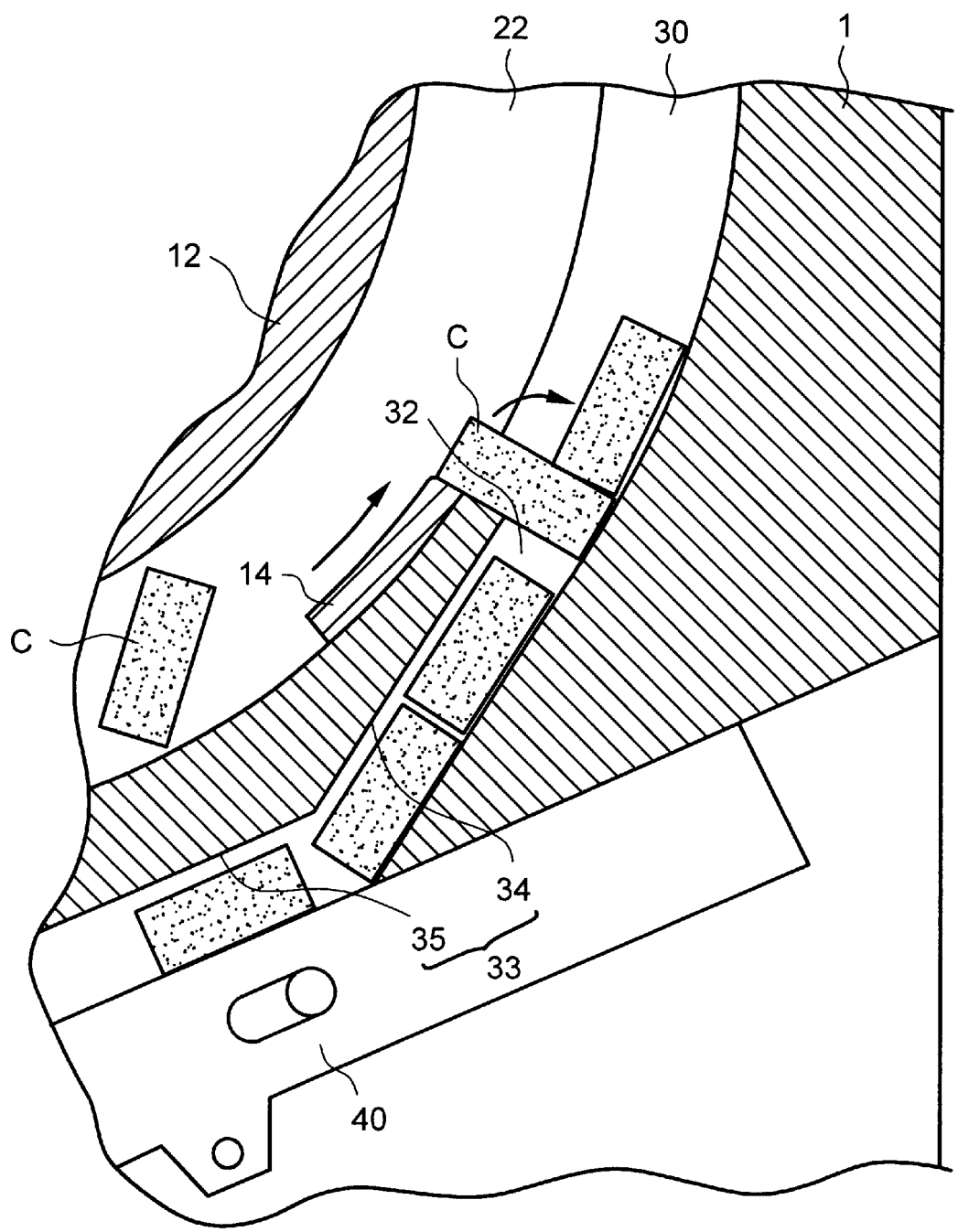
FIG. 6 is an enlarged sectional view of a portion of a gate.

On the side edge of the outer periphery of the above-mentioned rotary drum 10, a plurality of lug members 14 are protrudingly formed in uniformly spaced relation to each other in the peripheral direction. Although four lug members 14 spaced at 90° are illustrated in FIGS. 4 and 5, a greater number thereof may be formed. The lug members 14 are rotated passing through and over the gate 32 and the aligning groove 30, having functions of clearing the blockage of the chip components "C" at the gate 32 and of feeding the chip components "C" in the outer housing 22 into the aligning groove 30. That is, when the chip component "C" slides down along the aligning groove 30 in a standing orientation, it strikes the gate 32 and obstructs subsequent chip components "C" from passing by stopping there. When the rotary drum 10 rotates in the direction of the arrow, as shown in FIG. 6, the lug member 14 urges the chip component "C" stopping at the gate 32 in the opposite direction to the discharge path 33 to push the chip component "C" down to the horizontal position or to push the chip component "C" back toward the aligning groove 30. This results in clearing of the blockage at the gate 32.

The discharge path 33 comprises a first path 34 formed in the roughly tangential direction to the circular aligning groove 30 and a second path 35 intersecting with the first path 34. An angle of inclination "α" of the first path 34 is larger than an angle of inclination "β" of the second path 35, and it is preferable that "α" be selected to be more than 35° for ensuring the chip component "C" slides down in the first path 34, while the inclination "β" of the second path 35 may be below 35°.

On the bottom of the second path 35, a blade 40 formed of a thin metallic plate is longitudinally and moveably positioned with long holes 41 formed in the front and rear thereon. The blade 40 can reciprocate parallel to the second path 35 by inserting pins 42 protrudingly formed in the body 1 into the long holes 41. The stroke of the blade 40 is established to be smaller than the length of the chip component "C". The chip components "C" in the second path 35 can slide down smoothly, even if the angle of inclination "β" is small, by reciprocating the blade 40 back and forth by driving means (not shown) so as to overcome the friction between the chip component "C" in the second path 35 and the blade 40.

In addition, the bottom end of the second path 35 communicates with a pick-up unit (not shown).

The operation of the component feeder configured as above will now be described.

When chip components "C" are supplied into the external storage housing 2 by attaching the bulk case 4 to the component supplying inlet 3 at first, the chip components "C" are fed to the inner housing 21 by the inclinations of the bottom surface 2a of the external storage housing 2 and the supplying path 6. The number of chip components "C" is limited by the position of the outlet 6b of the supplying path 6. The chip components "C" entered into the inner housing 21 are gradually scooped up by the pockets 13 in accordance with the rotation of the rotary drum 10 so as to be fed into the reception inlet 23. Then they are guided to the outer housing 22 via the guide path 24.

The chip components "C" entered into the outer housing 22 are aligned in a predetermined direction by dropping into the aligning groove 30. Then the chip components "C" slide downward along the aligning groove 30 to the discharge path 33 via the gate 32. That is, since the selection of chip components "C" in the height and width directions thereof ("H" and "W" directions) is performed in the aligning groove 30 while the selection of chip components "C" in the length direction thereof ("L" direction) is performed in the gate 32, alignment and discharge efficiency is extremely increased in comparison with conventional bulk feeders. Although the chip component "C" standing up in the aligning groove 30 stops at the gate 32, since the lug members 14 pass over the gate 32 periodically in the opposite direction to that of discharge, the chip component "C" stopping at the gate 32 is pushed down to the horizontal orientation. Accordingly, the blockage is immediately cleared, preventing decrease in discharge efficiency.

The number of components supplied to the outer housing 22 from the inner housing 21 per unit time is determined by the number of pockets 13, the rotational speed of the rotary drum 10, the size of the reception inlet 23, and so forth. On the other hand, the number of components per unit time discharged from the outer housing 22 via the gate 32 is dependent on the aligning efficiency of the aligning groove 30, the number of lug members 14, the rotational speed of the rotary drum 10, and so forth. When the number of chip components "C" collected in the outer housing 22 exceeds an appropriate number, the aligning efficiency of chip components "C" in the aligning groove 30 may be decreased. However, in accordance with the present invention, since excess chip components "C" are returned from the outer housing 22 to the inner housing 21 via the return path 9 by the raking-up portion 16 rotating unitarily with the rotary drum 10, the number of chip components "C" in the outer housing 22 can be appropriately limited. Accordingly, chip components "C" can be efficiently slid into the aligning groove 30, resulting in maintaining high degrees of alignment and discharging efficiency. Further, since the chip components "C" are discharged to the discharge path 33 without being agitated for a long time, the chip components "C" will not be significantly damaged.

The chip components "C" entered into the discharge path 33 slide down on the first path 34 having a large inclination angle "α" toward the second path 35. Although the chip components "C" may be possibly left undischarged due to friction with the blade 40 because the angle of inclination "β" of the second path 35 is comparatively small, those chip components "C" can slide down smoothly by the longitudinal reciprocating movement of the blade 40.

In addition, since the angle of inclination "β" of the second path 35 is small, when the second path 35 is joined to the horizontal pick-up unit, an intersecting angle between the second path 35 and the pick-up unit can be established to be small so as to smoothly transfer the chip components "C" from the second path 35 to the pick-up unit. At the pick-up unit, the chip component "C" is picked up one by one by a pick-up apparatus such as a chip mounter.

Figure 10:
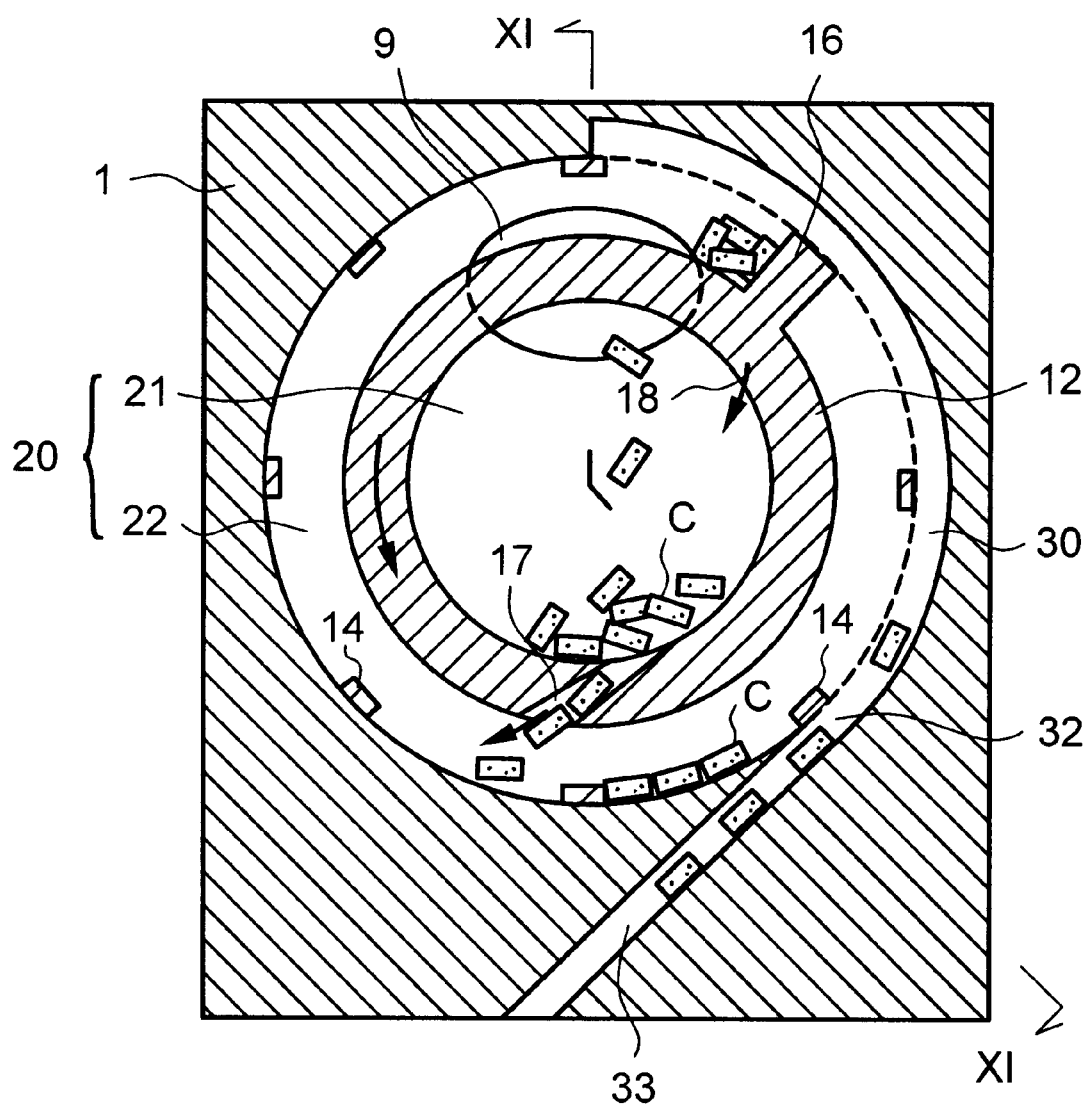
FIG. 10 is a sectional view of a component feeder according to a second embodiment of the present invention.
Figure 11:
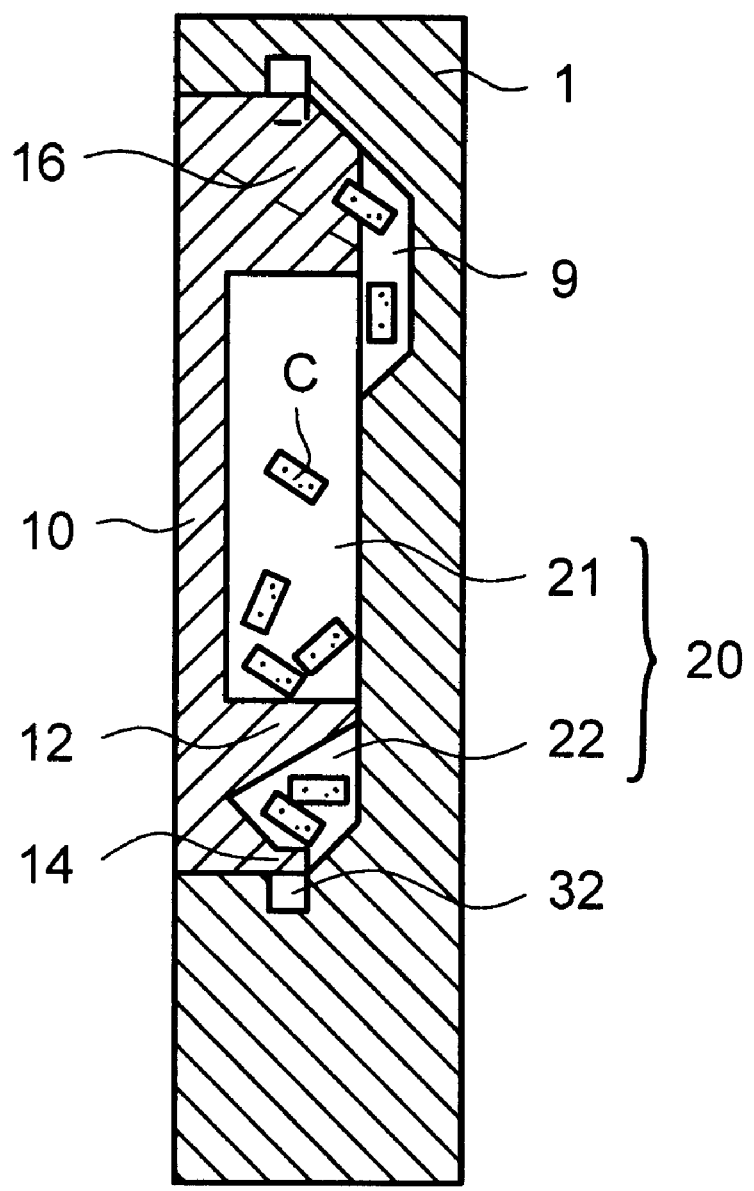
FIG. 11 is a sectional view along line XI—XI of FIG. 10.

FIGS. 10 and 11 show a second embodiment of the present invention, wherein like reference characters designate like functional portions common to each embodiment for brevity.

In this embodiment, as supplying means for supplying chip components "C" from the inner housing 21 to the outer housing 22 in response to the rotation of the rotary drum 10, a communicating path 17 is formed in the circumferential wall 12. Since the communicating path 17 is inclined toward the inner diameter of the rotary drum 10 relative to the rotational direction thereof, the chip components "C" in the inner housing 21 are scooped up, thereby corresponding to the rotation of the rotary drum 10, to be efficiently supplied into the outer housing 22. The chip component "C" supplied into the outer housing 22 cannot mesh with the chip component "C" in the outer housing 22, resulting in decreased damage to chip components "C". The number of communicating paths 17 is not limited to one, and plural communicating paths 17 may be formed.

In the rotary drum 10, lug members 14 are formed at 45° spacing, wherein the raking-up portion 16 is formed at the one position thereof instead. The return path 9 for returning the chip components "C" raked by the raking-up portion 16 from the outer housing 22 to the inner housing 21 is formed in the upper portion of the body 1.

In this embodiment, the chip components "C" in the inner housing 21 gradually enter the outer housing 22 via the communicating path 17 in response to the rotation of the rotary drum 10. Then they are discharged and aligned in a line from the discharge path 33 via the aligning groove 30 and the gate 32. Among the chip components "C" in the outer housing 22, the chip components "C" not dropped into the aligning groove 30 are raked up by the raking-up portion 16 so as to be returned to the inner housing 21 via the return path 9. Therefore the number of the chip components "C" in the outer housing 22 is limited to be small, resulting in maintaining high degrees of alignment and discharging efficiency.

Figure 12:
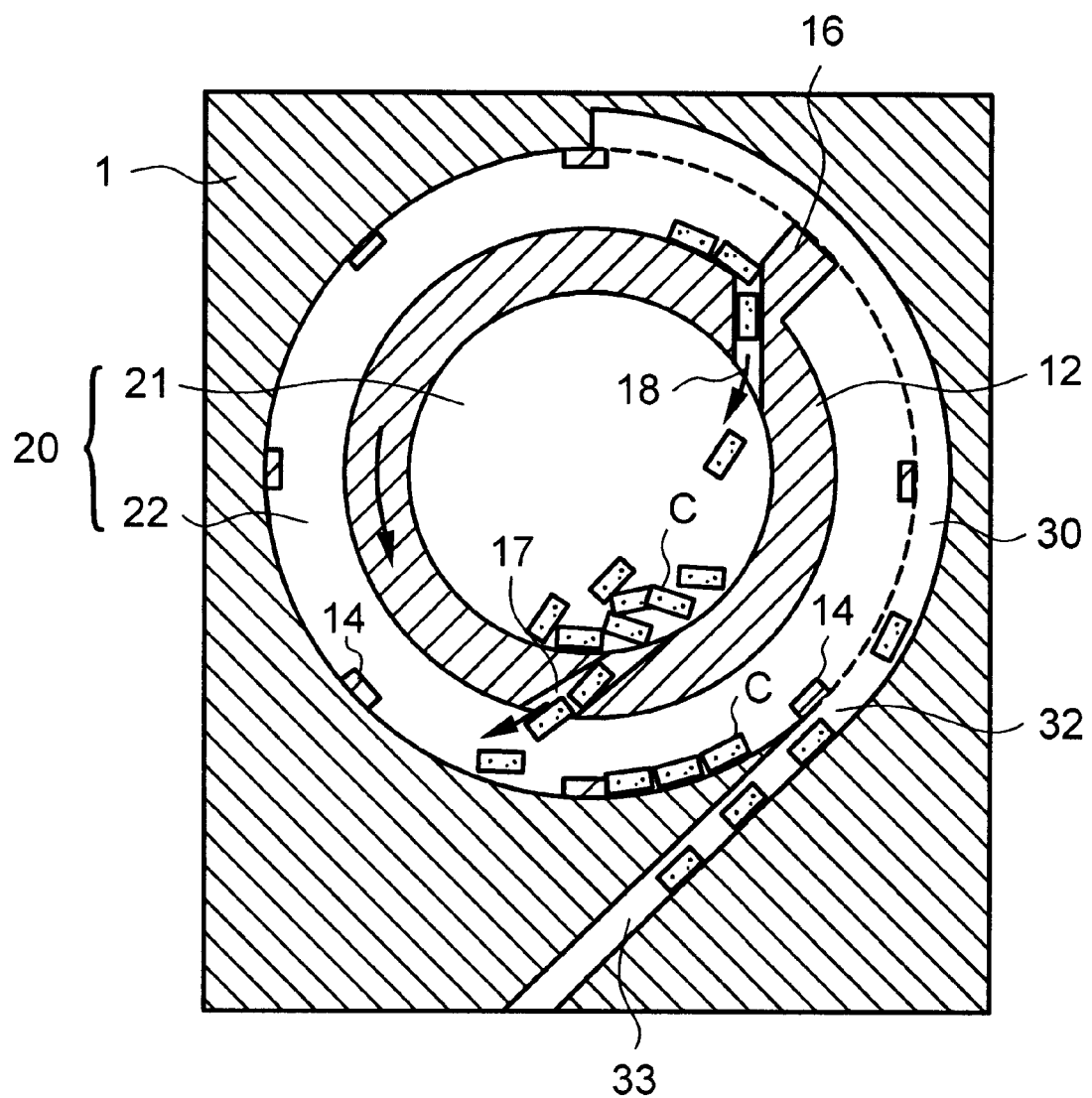
FIG. 12 is a sectional view of a component feeder according to a third embodiment of the present invention.

FIG. 12 shows a third embodiment of the present invention, wherein like reference characters designate like functional portions common to each embodiment for brevity.

In this embodiment, a return path 18 for returning chip components "C" from the outer housing 22 to the inner housing 21 is formed in the circumferential wall 12 of the rotary drum 10, and as raking means for supplying the chip components "C" in the outer housing 22 to the return path 18, a return lug member 16 is protrudingly formed on the outer peripheral surface of the circumferential wall 12, as in the first and second embodiments. The above-mentioned return path 18 passes through the circumferential wall 12 from the immediately front position of the return lug member 16 in the rotational direction so as to communicate with the inner periphery of the circumferential wall 12, and is inclined toward the outer diameter of the rotary drum 10 relative to the rotational direction thereof. That is, it is inclined in the direction opposite to the supplying communicating path 17.

When chip components "C" are supplied to the return path by raking means at the high rotating speed of the rotary drum 10, the flipped chip components "C" are difficult to enter into the return path. Therefore, excess components accumulate in the outer housing so as to decrease aligning efficiency. In contrast, the chip components "C" struck by the return lug member 16 can easily enter the return path 18 by positioning the aperture of the return path 18 at the immediately front position of the return lug member 16 in the rotational direction. Since the return path 18 is inclined toward the outer diameter of the rotary drum 10 relative to the rotational direction thereof, when the return path 18 is rotated to the upper portion of the rotary drum 10, the inclination angle thereof is to be steep so that the chip components "C" in the return path 18 can be easily dropped into the inner housing 21. In contrast, when the return path 18 is rotated to the lower portion of the rotary drum 10, the inclination angle thereof is to be gentle and the chip components "C" pass through over the aperture of the return path 18 in the outer housing side, resulting in preventing the chip components "C" from reversing from the inner housing 21 to the outer housing 22.

The numbers of the return lug members 16 and the return paths 18 are not limited to one, respectively, and a plurality thereof may be formed.

The component feeder according to the present invention is not limited to the above-described embodied structures.

While in the first embodiment, the concave-shaped pockets 13 are formed on the inner peripheral surface of the circumferential wall 12 of the rotary drum 10, the pockets are not limited to this structure; for example, the pockets may be configured by fixing raking plates on the inner surface of the circumferential wall 12 with appropriate spaces.

While in the above-described embodiments, the aligning and discharging section is formed of the circular aligning groove 30, the gate 32, the discharge path 33, and the lug members 14, it is not limited to this structure; for example, the aligning and discharging section may be configured by forming a communicating path on a different circumferential wall formed on the outer peripheral side of the circumferential wall 12. In this case, the gate and the lug members are not required.

While in the first embodiment, the discharge path 33 is formed of the first path 34 with a large inclination angle "α" and the second path 35 having the blade 40 and a small inclination angle "β", the discharge path may be formed of only one path, as in the second embodiment.

While in the above-described embodiments, the bulk case 4 is detachably formed on the upper portion of the external storage housing 2, chip components "C" may be directly supplied into the external storage housing 2 without using the bulk case 4.

In addition, the external storage housing 2 is not indispensable in the present invention; for example, chip components "C" may be directly supplied into the inner housing 21.

Further, a new embodiment can be obtained by combining each constituent in the first to the third embodiment with others.

As will be understood from the above description, in accordance with the present invention, since excess components in the outer housing are returned to the inner housing via the return path by raking them up by raking-up means, excess components are not accumulated in the outer housing, and chip components are discharged by being aligned in a line by the aligning and discharging section. Accordingly, entanglements of chip components in the outer housing can be prevented; a high grade of alignment efficiency can usually be maintained; and damage to components by meshing with each other can be reduced.

What is claimed is:

1. A component feeder comprising:

a feeder body;

a rotary drum rotating relative to said feeder body about a horizontal axis;

a component storage housing formed between said feeder body and said rotary drum for storing chip components;

a circumferential wall formed in said rotary drum, which divides said component storage housing into an inner housing and an outer housing;

supplying means for supplying a predetermined number of chip components at a time from the inner housing to the outer housing in accordance with the rotation of said rotary drum;

an aligning and discharging section disposed in the outer housing for aligning chip components in a line and discharging them;

a return path for returning chip components from the outer housing to the inner housing; and raking-up means rotating along the outer housing for raking up excess chip components in the outer housing so as to return them to the inner housing via said return path.

2. A component feeder according to claim 1, wherein said supplying means comprises a pocket disposed in said circumferential wall for raking up a predetermined number of chip components in the inner housing at a time in accordance with the rotation of said rotary drum, a reception inlet disposed in a position of said feeder body facing to the inner housing for receiving chip components raked up by the pocket, and a guide path disposed in said feeder body for guiding chip components received by the reception inlet to the outer housing.

3. A component feeder according to claim 1, wherein said supplying means is a communicating path formed so as to form a connection between the inner peripheral side of said circumferential wall and the outer peripheral side thereof for transferring chip components from the inner housing to the outer housing in accordance with the rotation of said rotary drum.

4. A component feeder according to claim 1, wherein said raking-up means is unitarily formed with said rotary drum.

5. A component feeder according to claim 1, wherein said raking-up means is a return lug member protrudingly formed on the outer peripheral surface of said circumferential wall, and wherein said return path is a communicating path which passes through said circumferential wall from the immediately front position of the return lug member in the rotational direction so as to communicate with the inner peripheral side of said circumferential wall, being inclined toward the outer diameter of said rotary drum relative to the rotational direction thereof.

6. A component feeder according to claim 1, further comprising:

an external storage housing disposed in the upper portion of the inner housing; and a supplying path for supplying the chip components from said external storage housing to the inner housing, being inclined downward from said external storage housing toward the inner housing.

7. A component feeder according to claim 6, further comprising a bulk case for accommodating a predetermined number of chip components, said bulk case being detachably disposed with an opening potion thereof directed downward on a component supplying inlet formed in the upper portion of said external storage housing.

8. A component feeder according to claim 1, wherein said aligning and discharging section is formed on an inner surface of said feeder body forming the outer housing, said aligning and discharging section comprising an aligning groove for aligning chip components in a predetermined direction so as to slide the chip components downward, a gate formed at a lower end of the aligning groove for passing the chip components therethrough sliding along the aligning groove in a predetermined orientation one at a time, and a discharge path joined to a lower portion of the gate, being inclined downward, and wherein said rotary drum is provided with a lug member for urging the chip component standing at the gate in an abnormal orientation to move toward the opposite direction to that of discharge so as to clear the blockage.

9. A component feeder according to claim 2, wherein said raking-up means is unitarily formed with said rotary drum.

10. A component feeder according to claim 3, wherein said raking-up means is unitarily formed with said rotary drum.

11. A component feeder according to claim 2, wherein said raking-up means is a return lug member protrudingly formed on the outer peripheral surface of said circumferential wall, and wherein said return path is a communicating path which passes through said circumferential wall from the immediately front position of the return lug member in the rotational direction so as to communicate with the inner peripheral side of said circumferential wall, being inclined toward the outer diameter of said rotary drum relative to the rotational direction thereof.

12. A component feeder according to claim 3, wherein said raking-up means is a return lug member protrudingly formed on the outer peripheral surface of said circumferential wall, and wherein said return path is a communicating path which passes through said circumferential wall from the immediately front position of the return lug member in the rotational direction so as to communicate with the inner peripheral side of said circumferential wall, being inclined toward the outer diameter of said rotary drum relative to the rotational direction thereof.

13. A component feeder according to claim 4, wherein said raking-up means is a return lug member protrudingly formed on the outer peripheral surface of said circumferential wall, and wherein said return path is a communicating path which passes through said circumferential wall from the immediately front position of the return lug member in the rotational direction so as to communicate with the inner peripheral side of said circumferential wall, being inclined toward the outer diameter of said rotary drum relative to the rotational direction thereof.

14. A component feeder according to claim 2, further comprising:
an external storage housing disposed in the upper portion of the inner housing; and
a supplying path for supplying the chip components from said external storage housing to the inner housing, being inclined downward from said external storage housing toward the inner housing.

15. A component feeder according to claim 3, further comprising:
an external storage housing disposed in the upper portion of the inner housing; and
a supplying path for supplying the chip components from said external storage housing to the inner housing, being inclined downward from said external storage housing toward the inner housing.

16. A component feeder according to claim 4, further comprising:
an external storage housing disposed in the upper portion of the inner housing; and
a supplying path for supplying the chip components from said external storage housing to the inner housing, being inclined downward from said external storage housing toward the inner housing.

17. A component feeder according to claim 5, further comprising:
an external storage housing disposed in the upper portion of the inner housing; and
a supplying path for supplying the chip components from said external storage housing to the inner housing, being inclined downward from said external storage housing toward the inner housing.

18. A component feeder according to claim 2, wherein said aligning and discharging section is formed on an inner surface of said feeder body forming the outer housing, said aligning and discharging section comprising an aligning groove for aligning chip components in a predetermined direction so as to slide the chip components downward, a gate formed at a lower end of the aligning groove for passing the chip components therethrough sliding along the aligning groove in a predetermined orientation one at a time, and a discharge path joined to a lower portion of the gate, being inclined downward, and wherein said rotary drum is provided with a lug member for urging the chip component standing at the gate in an abnormal orientation to move toward the opposite direction to that of discharge so as to clear the blockage.

19. A component feeder according to claim 3, wherein said aligning and discharging section is formed on an inner surface of said feeder body forming the outer housing, said aligning and discharging section comprising an aligning groove for aligning chip components in a predetermined direction so as to slide the chip components downward, a gate formed at a lower end of the aligning groove for passing the chip components therethrough sliding along the aligning groove in a predetermined orientation one at a time, and a discharge path joined to a lower portion of the gate, being inclined downward, and wherein said rotary drum is provided with a lug member for urging the chip component standing at the gate in an abnormal orientation to move toward the opposite direction to that of discharge so as to clear the blockage.

20. A component feeder according to claim 4, wherein said aligning and discharging section is formed on an inner surface of said feeder body forming the outer housing, said aligning and discharging section comprising an aligning groove for aligning chip components in a predetermined direction so as to slide the chip components downward, a gate formed at a lower end of the aligning groove for passing the chip components therethrough sliding along the aligning groove in a predetermined orientation one at a time, and a discharge path joined to a lower portion of the gate, being inclined downward, and wherein said rotary drum is provided with a lug member for urging the chip component standing at the gate in an abnormal orientation to move toward the opposite direction to that of discharge so as to clear the blockage.

21. A component feeder according to claim 5, wherein said aligning and discharging section is formed on an inner surface of said feeder body forming the outer housing, said aligning and discharging section comprising an aligning groove for aligning chip components in a predetermined direction so as to slide the chip components downward, a gate formed at a lower end of the aligning groove for passing the chip components therethrough sliding along the aligning groove in a predetermined orientation one at a time, and a discharge path joined to a lower portion of the gate, being inclined downward, and wherein said rotary drum is provided with a lug member for urging the chip component standing at the gate in an abnormal orientation to move toward the opposite direction to that of discharge so as to clear the blockage.

22. A component feeder according to claim 6, wherein said aligning and discharging section is formed on an inner surface of said feeder body forming the outer housing, said aligning and discharging section comprising an aligning groove for aligning chip components in a predetermined direction so as to slide the chip components downward, a gate formed at a lower end of the aligning groove for passing the chip components therethrough sliding along the aligning groove in a predetermined orientation one at a time, and a discharge path joined to a lower portion of the gate, being inclined downward, and wherein said rotary drum is provided with a lug member for urging the chip component standing at the gate in an abnormal orientation to move toward the opposite direction to that of discharge so as to clear the blockage.

23. A component feeder according to claim 7, wherein said aligning and discharging section is formed on an inner surface of said feeder body forming the outer housing, said aligning and discharging section comprising an aligning groove for aligning chip components in a predetermined direction so as to slide the chip components downward, a gate formed at a lower end of the aligning groove for passing the chip components therethrough sliding along the aligning groove in a predetermined orientation one at a time, and a discharge path joined to a lower portion of the gate, being inclined downward, and wherein said rotary drum is provided with a lug member for urging the chip component standing at the gate in an abnormal orientation to move toward the opposite direction to that of discharge so as to clear the blockage.

* * * * *